FULL ADDER
Filed April 30, 1962
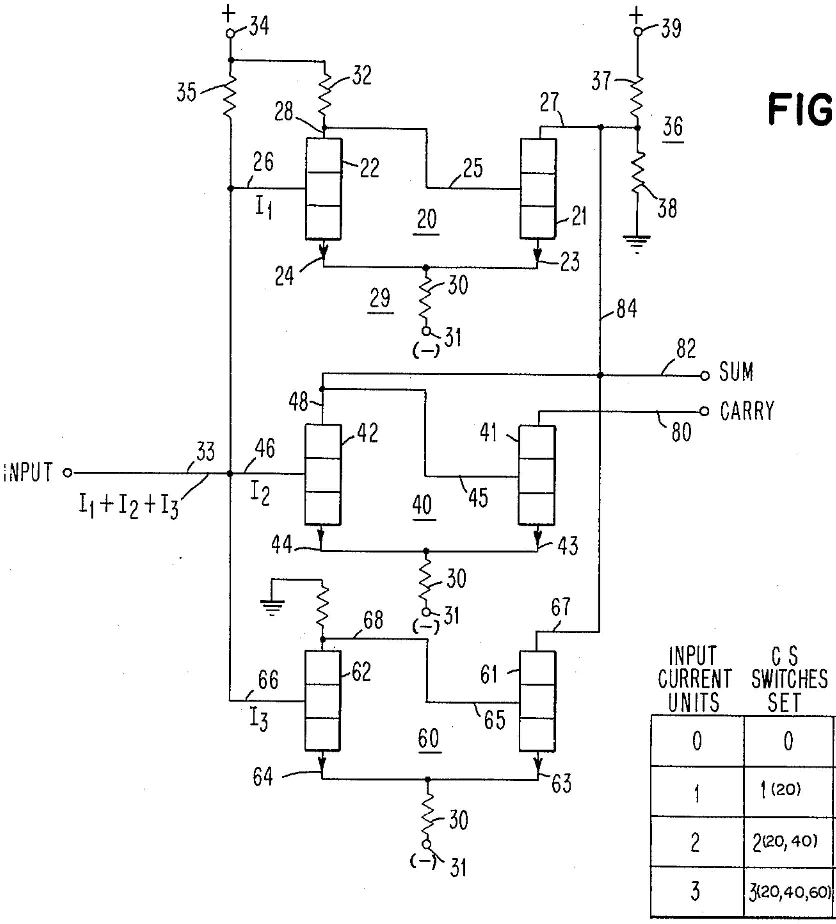
FIG. 1
FIG. 3
| INPUT CURRENT UNITS | C S SWITCHES SET | SUM | CARRY |
|---|---|---|---|
| 0 | 0 | 0 | 0 |
| 1 | 1 (20) | 1 | 0 |
| 2 | 2(20, 40) | 0 | 1 |
| 3 | 3(20,40,60) | 1 | 1 |
FIG. 2A FIG. 2B FIG. 2C FIG. 2D FIG. 2E FIG. 2F
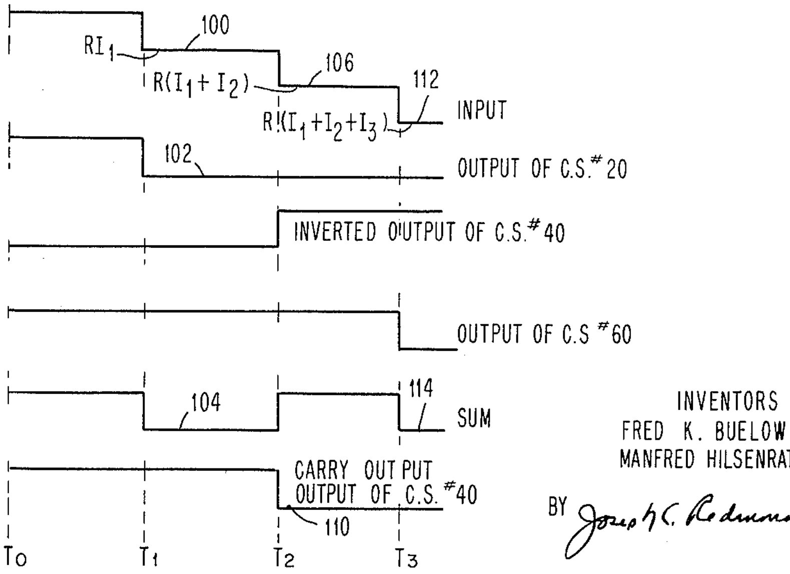
INVENTORS
FRED K. BUELOW
MANFRED HILSENRATH
BY Joseph C. Redmond Jr.
ATTORNEY United States Patent Office 3,248,529
Patented Apr. 26, 1966

3,248,529
FULL ADDER

Fred K. Buelow, Poughkeepsie, and Manfred Hilsenrath, Wappingers Falls, N.Y., assignors to International Business Machines Corporation, New York, N.Y., a corporation of New York Filed Apr. 30, 1962, Ser. No. 191,009
10 Claims. (Cl. 235—172)

This invention relates to switching circuits and, more particularly, to switching circuits for binary addition of a plurality of electrical impulses.

Binary adders employed in information handling apparatus should be simple in construction, reliable in operation and offer a minimum of delay to input signals. One source of delay is the coupling elements required for interconnecting active circuit elements. Another source of delay is the number of logic circuits or levels necessary to perform the binary addition. Elimination or reduction of these signal delays should permit operation of binary adders at speeds of the order of 3 nanoseconds (ns.) presently required in information handling apparatus.

A general object of the invention is an improved switching circuit having minimum signal delay and relatively few circuit elements.

Another object is a switching circuit adapted to add electrical impulses in a binary manner and require a minimum amount of power.

Another object is a full adder suitable for manufacture in integrated circuit form.

These and other objects are accomplished in accordance with the present invention, one illustrative embodiment of which comprises a plurality of feedback current switches, each switch including a pair of direct coupled amplifiers having a feedback path between corresponding electrodes. The second electrodes of each switch are coupled together and thereafter to an input circuit. A biasing circuit adapts the circuit so that corresponding amplifiers of the switches are conducting and nonconducting, respectively, in the absence of an input signal. One feedback switch is coupled to the third electrodes of the other feedback switches to provide a sum output circuit. The third electrode of the one feedback switch is also connected to a carry output circuit. A first input signal reverses the conducting states of one switch to provide a signal to the sum output circuit after a single logic delay. A second input signal reverses the conducting state of a second feedback switch to nullify the signal to the sum circuit and simultaneously provide a signal to the carry circuit. A third input signal reverses the conducting state of a third feedback switch to reinstate the signal at the sum circuit and continue the signal to the carry circuit. Since the sum signal appears after one logic delay, the circuit response is rapid to the input signal. All feedback switches are directly coupled amplifier configurations which minimize the passive elements and the signal delays associated therewith. Thus, the circuit performance is rapid and with reduced power dissipation. The switching operation is reliable due to the feedback operation and the novel circuit configuration permits manufacture thereof in integrated circuit form.

One feature of the invention is a plurality of amplifiers having minimum signal delay to input signals, the amplifiers being coupled together to add and subtract from the current supplied to a pair of output circuits as a series of signals appear at the input to the amplifiers.

Another feature is a feedback switch employing a pair of direct coupled amplifiers having one set of corresponding electrodes coupled together so that when one amplifier is conducting, the other amplifier will be nonconducting and in response to an input signal, the one amplifier will be turned off and held off by a feedback signal generated by the other amplifier which turns on in response to the input signal.

Another feature is a full adder having a plurality of feedback switches, a sum circuit and a carry circuit, the sum circuit being connected to a feedback switch so that a sum signal is generated after a single delay of the input signal.

Another feature is a plurality of feedback switches coupled together so that they respond successively to input signals to control a sum and carry circuit in providing full adder operation.

The foregoing and other objects, features and advantages of the invention will be apparent from the following more particular description of a preferred embodiment of the invention as illustrated in the accompanying drawing.

FIGURE 1 is an electrical schematic of one embodiment of the present invention.

FIGURE 2A is a voltage-time graph of signals applied to the input of the circuit shown in FIGURE 1.

FIGURE 2B is a voltage-time graph of a current switch included in FIGURE 1.

FIGURE 2C is a voltage-time graph of an inverted output of a second current switch included in FIGURE 1.

FIGURE 2D is a voltage-time graph of an output of a third current switch included in FIGURE 1.

FIGURE 2E is a voltage-time graph of a sum output for the circuit of FIGURE 1.

FIGURE 2F is a voltage-time graph of a carry output for the circuit of FIGURE 1.

FIGURE 3 is a Truth Table for the circuit of FIGURE 1.

Referring to FIGURE 1, a first current switch 20, a second current switch 40 and a third current switch 60 are suitably connected together to form a full adder responsive to electrical impulses. Each current switch is similar in construction so that only one switch need be described in detail for purposes of the description. Accordingly, the same circuit elements will have the same or corresponding reference characters. Arbitrarily selecting the current switch 20, there is included therein a first amplifier 22 having an emitter electrode 24, base electrode 26 and collector electrode 28, and a second amplifier 21 including an emitter electrode 23, base electrode 25 and collector electrode 27. The emitter electrodes 23 and 24 are connected to a current source 29 including a resistor 30 and a source of voltage 31. The collector electrode of the amplifier 22 is directly connected to the base electrode of the amplifier 21. The collector electrode 28 is also connected through a suitable load resistor 32 to a voltage supply 34 of suitable polarity. The collector electrode 27 of the amplifier 21 is connected to the midpoint of a voltage divider 36 including resistors 37 and 38. One end of the divider is connected to a source of voltage 39 and the other end is connected to a source of reference potential, typically ground. The base electrodes of the amplifiers 22, 42 and 62 are coupled together and biased from the supply 34 through a resistor 35. The base electrodes are also connected to input circuit 33. To prevent saturation of the amplifiers requires that the forward bias of the collector base junction not exceed the level of noticeable minority carrier injection. For silicon transistors the signal voltage swing for direct wire connection is then limited to a maximum of 600 millivolts. This feature insures that direct coupling may be employed among the switches since there is no D.C. level shift.

The current switches 40 and 60 have slightly different circuit configuration than that of the current switch 20. In the case of the current switch 40, the amplifier 42 is connected to the divider 36 instead of the amplifier 41, the latter amplifier having its collector electrodes connected to a carry circuit 80. In the case of the current switch 60, the collector electrode of the amplifier 62 is returned to a supply voltage, at a different level from that of the supply 34. The collector electrode of the current switch or amplifier 60, however, is returned to the voltage divider 36. In the case of both the current switches 40 and 60 the magnitudes of the resistors 30 are different than the resistor 30 of the switch 20. The magnitudes of the resistors R30 are given by the relation $R30_{20}>R30_{40}>R30_{60}$ for reasons more apparent hereinafter. The subscripts 20, 40 and 60 correspond to the current switch with which it is associated.

A sum circuit 82 is connected to lead 84 interconnecting the collector electrodes of the amplifiers 21, 41 and 61. The carry circuit is connected to the collector of the amplifier 41 as previously indicated.

Normally, the amplifiers 22, 42 and 62 are conducting and the amplifiers 21, 41 and 61 are nonconducting. The amplifiers 22, 42 and 62 as described in previously filed application Serial No. 189,163 filed April 20, 1962, assigned to the same assignee as that of the present invention, have a negative resistance characteristic. To assure maximum gain for these amplifiers, their load lines are selected to be tangent to the negative resistance region. Each amplifier, as a result, will switch more than 90 percent of its current with less than 15 millivolts input. Also, the output is under continuous control of the input due to the monostable load line. The bias voltage appearing at the base electrodes 26, 46 and 66 from the supply 34 are above the emitter potentials of these amplifiers. With the amplifiers 22, 42 and 62 conducting, the collector potentials thereof approach the voltage of the supply 31 which is negative in character so that the amplifiers 21, 41 and 61 are nonconducting. The supply 39 and the divider 36 provide one unit of current to the sum circuit 82. The carry circuit 80 has little or no current flowing therein because the amplifier 41 is cut off. In this condition the circuit is ready to accept signals at the input circuit 33. The input signal may be one of three different levels. Each level may be thought of as comprising a different number of binary signals. Thus, the first level has one binary signal and the absence of two others. The second level has two binary signals and the absence of one binary signal. The third level has three binary signals. The present adds in a binary manner the binary signals appearing in a signal level.

A first input signal 100 indicated in FIGURE 2A provides a voltage drop across the resistor 35 which reduces the base-emitter voltage of the transistor 22 so that turn-off occurs. The amplifiers 42 and 62 do not turn off because emitter resistors 30 are of lesser value so that the emitter electrodes 44 and 64 are still more negative in value than that appearing at the common base connection. When turn-off of the amplifier 22 occurs, the collector potential rises toward the supply 34 which results in the amplifier 21 being turned on. The emitter 23 of the amplifier 21 rises toward the voltage appearing at the base electrode 24 which is positive in character and develops a feedback signal which is transmitted to the common lead between the emitters to further reverse bias the emitter base voltage of the amplifier 22. The feedback signal maintains the amplifier 22 cut off as long as the input signal is present. With the amplifier 22 turned off and the amplifier 21 turned on, an additional unit of current flows from the source 34 through the resistor 32 and amplifier 21 to the sum circuit. The collector voltage of the amplifier 27, as a result, falls toward the negative supply 31 and provides an output signal 102 indicated in FIGURE 2B. The additional unit of current to the sum circuit produces an output signal 104 indicated in FIGURE 2E.

A second input pulse 106 combined with the pulse 100 further increases the voltage drop across the resistor 35 to lower the base voltage of the amplifier 42 below the emitter voltage so that turn-off occurs. The amplifier 41 turns on and in so doing, retains the amplifier 42 nonconducting. The amplifier 62 does not turn on because the emitter voltage is still below that of the base voltage so that conduction is maintained. When the amplifier 41 turns on, the one unit of current flowing to the coupling lead 84 is shunted therethrough, and thence to the carry circuit 80. As a result, the sum output circuit returns to the normal condition as indicated in FIGURE 2E. The collector potential for the amplifier 42 increases as indicated in FIGURE 2C. The carry circuit connected to the collector of the amplifier 41, however, is changed due to the one unit of current flowing therethrough. A carry output pulse 110 appears as indicated in FIGURE 2F.

A third input signal 112 combined with the pulses 100 and 106 and indicated in FIGURE 2A, turns off the amplifier 62 and turns on the amplifier 61. A unit of current is supplied to the coupling circuit 84 from the supply connected to the collector electrode of the amplifier 62, the unit of current flowing through the amplifier 61 and thence to the coupling circuit 84. The current level in the sum circuit 82 is changed to indicate a pulse condition 114. The carry circuit remains in the previous condition so that the circuit has indicated the binary addition of three successive electrical impulses.

The operation of the circuit shown in FIGURE 1 is summarized in FIGURE 3 which is a Truth Table for the various input conditions.

The adder is rapid in operation since the sum and carry signal appear after a single logic delay. Also, the elimination of impedance elements through direct coupling further increases the speed of the circuit from delays due to such elements. Further, the supply voltages for the circuit are of the order of 3 v. for the emitter supplies and .3 v. for the collector supply. This feature enables the circuit to be manufactured in integrated circuit form in accordance with well known manufacturing processes. The low voltages and elimination of circuit elements for coupling the active elements reduce the power dissipation of the circuit so that the adder may be packaged as a single module. The volume of the module is made relatively small so that a relatively large number of modules may be packaged in a small volume. Thus, the present invention has disclosed a switching circuit that is fast in operation due to the sum and carry circuit having a single delay in providing an output signal. The feedback feature of the current switches insures positive operation in response to the input signals so that the circuits are reliable in operation. The small signals and power supply voltages render the circuit amenable for manufacture in integrated circuit form. Another application of the present invention is a variable threshold gate. The switches 20, 40 and 60 may have their outputs commoned to a single load resistor. Since each circuit can switch a discrete current, there are four possible input levels. By varying the collector supply voltage, the threshold can be adjusted to respond to either 1, 2 or 3 units of input current. In practice the collector voltage is most conveniently obtained with a Thevenin equivalent. If such a circuit responds to one unit of current, an OR operation is performed. If the circuit responds to two out of three inputs, a majority operation is performed. Operation in response to all units of current is an AND function. It can be shown that the binary adder circuit previously described, is a combination of these AND, OR and Majority functions and that the sum and carry signals appear after only one level of circuit delay. This delay for circuits that employ Fairchild Semiconductor Transistor 2N709 is under 3 nanoseconds (ns.) with typical loading.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A non-saturating feedback current switch comprising a first signal translating element having collector, base, and emitter electrodes, a second signal translating element having collector, base, and emitter electrodes, a direct connection between the first collector electrode of the first signal translating element and the base electrode of the second signal translating elements, a feedback connection between emitter electrodes of the first and second signal translating elements, an input circuit connected to the base electrode of the first signal translating element, said input circuit providing at least three input signal levels wherein a majority logic function is performed in response to the three input signal levels, and means including at least one impedance element biasing the signal translating elements whereby one element is normally conducting and the other element is normally nonconducting and for a preselected input signal level the conducting conditions of the elements will be interchanged, the biasing means establishing a monostable load line for the first signal translating element thereby minimizing the preselected input signal level necessary to interchange the conducting conditions of the translating elements.

2. The feedback current switch defined in claim 1 wherein an AND logic function is performed in response to the three input signal levels.

3. An adder comprising first, second and third feedback current switches, an input circuit connected to all feedback current switches, said input circuit adapted to receive first, second and third signal levels, each signal level corresponding to a different number of binary signals, means biasing the first, second and third feedback current switches to be responsive to the first, second and third signal levels, respectively, means connected to the feedback current switches to add in a binary manner the binary signals appearing in the signal level appearing at the input current, the binary addition being completed within a single logical delay equal to the switching time of a current switch, and means connected to the feedback current switch responsive to the second signal level to produce a carry signal for the signal level appearing at the input circuit, the carry signal being completed within a single logical delay equal to the switching time of a current switch.

4. An adder comprising first, second and third feedback current switches, each current switch being responsive to a different signal level, an input circuit connected to all current switches, said input circuit adapted to receive at least three different signal levels with respect to a reference level, a sum circuit, a carry circuit, and means interconnecting the current switches to alternately connect at least one current switch to the sum circuit for successively increasing input signal levels and to prevent connection of a current switch to the carry circuit until at least the second and third levels appear at the input circuit.

5. An adder comprising first, second and third feedback current switches, each current switch including first and second signal translating elements, means biasing the current switches to be responsive to a different signal level, an input circuit connected to the first signal translating elements of each current switch, said input circuit adapted to supply at least first and second input signal levels, a load circuit connected to the second, first and second signal translating elements of the first, second and third current switches, respectively, a sum circuit connected to the load circuit, the sum circuit providing an output within a single logical delay equal to the switching time of a current switch, and a carry circuit connected to the second translating element of the second current switch, the carry circuit providing an output within a single logical delay equal to the switching time of a current switch.

6. An adder comprising first, second and third current switches, each current switch including first and second signal translating elements connected in cascade relation, means biasing the current switches so that corresponding signal translating elements are conducting and respond to different signal levels, an input circuit connected to all current switches and adapted to provide first, second and third signal levels, a load circuit, means connecting the load circuit to the second, first and second signal translating elements of the first, second and third current switches, respectively, a sum circuit connected to the first signal translating of the second current switch, the sum circuit providing an output upon the appearance of a first or third signal level and after a single logical delay equal to the switching time of a current switch and a carry circuit connected to the second signal translating element of the second current switch the carry circuit provided an output upon the appearance of a second or third signal level and after a single logical delay equal to the switching time of a current switch.

7. An adder comprising first, second and third current switches, each current switch having first and second stable conditions and normally biased into the first stable condition, an input circuit adapted to supply first, second and third signal levels, each signal level corresponding to a different number of binary signals, said input circuit connected to control the stable condition of the respective current switches, means biasing the current switches so that they respond to different input signal levels, the first, second and third current switches changing to the second stable condition for the first, second and third input signal levels, respectively, means connected to the current switches to permit addition of the binary signals contained in an input signal level and providing an output signal indicative of the binary addition after a single logical delay equal to the switching time of a current switch, and means providing a carry signal based upon the binary addition and wherein the carry signal is provided after a single logical delay.

8. An arithmetic circuit comprising first, second and third switching circuits, each switching circuit comprising first and second transistors, each transistor having base, emitter and collector electrodes, the emitter electrodes of the first and second transistors connected through an impedance to a source of voltage, the collector electrodes of each transistor connected to a biasing supply, the collector electrodes of the first transistors also connected to the base electrode of the second transistors, a biasing means including an impedance connected to a source of voltage, a common input circuit connected to the base electrodes of the first transistors in each switching circuit and to the biasing means, a sum circuit connected to the collectors of the second, first and second transistors of each switching circuit, a carry circuit connected to the collector of the second transistor of the second switching circuit, the first transistor of each switching circuit being normally in a conducting condition and having a monostable load line whereby a first signal level input will switch the first switching circuit and provide a single output at the sum circuit; a second signal input will switch the first and second switching circuits and provide a single output at the carry circuit and a third signal input will switch the first, second and third switching circuits and provide outputs at the sum and carry circuits.

9. The arithmetic circuit defined in claim 8 wherein the impedance, connected to the emitter electrodes of the transistors in each switching circuit, has different magnitudes to permit respective switching circuits to operate in sequence to the different input signal levels.

10. The arithmetic circuit defined in claim 9 wherein the transistors of each switching circuit are operated nonsaturating.

References Cited by the Examiner

UNITED STATES PATENTS

| | | | |
|---|---|---|---|
| 2,453,454 | 11/1948 | Norwine | 328—152 |
| 2,869,785 | 1/1959 | Adams | 235—172 |
| 2,885,149 | 5/1959 | Clapper | 235—172 |
| 2,920,216 | 1/1960 | Brauer | 307—88.5 |
| 2,990,480 | 6/1961 | Ellsworth | 307—88.5 |
| 3,021,437 | 2/1962 | Fleisher | 307—88.5 |
| 3,043,511 | 7/1962 | Scott | 235—172 |
| 3,084,266 | 4/1963 | Williams | 307—88.5 |
| 3,089,962 | 5/1963 | Foote | 307—88.5 |
| 3,148,274 | 9/1964 | Davis | 235—172 |

ROBERT C. BAILEY, *Primary Examiner.*

MALCOLM A. MORRISON, *Examiner.*

M. A. LERNER, *Assistant Examiner.*